US010530318B2

(12) United States Patent
Powell et al.

(10) Patent No.: US 10,530,318 B2
(45) Date of Patent: Jan. 7, 2020

(54) AUDIO SYSTEM HAVING VARIABLE RESET VOLUME

(71) Applicant: Apple Inc., Cupertino, CA (US)

(72) Inventors: Richard M. Powell, Mountain View, CA (US); Kshitij S. Deshpande, San Jose, CA (US); David Chance Graham, San Jose, CA (US); Hugo Verweij, San Francisco, CA (US); Afrooz Family, Emerald Hills, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/048,161

(22) Filed: Jul. 27, 2018

(65) Prior Publication Data

US 2019/0165748 A1 May 30, 2019

Related U.S. Application Data

(60) Provisional application No. 62/593,158, filed on Nov. 30, 2017.

(51) Int. Cl.
| | |
|---|---|
| *G06F 3/16* | (2006.01) |
| *H03G 3/32* | (2006.01) |
| *H03G 3/34* | (2006.01) |
| *H03G 3/30* | (2006.01) |

(52) U.S. Cl.
CPC .............. *H03G 3/32* (2013.01); *G06F 3/165* (2013.01); *H03G 3/3026* (2013.01); *H03G 3/344* (2013.01)

(58) Field of Classification Search
CPC ............ G06F 3/165; H03G 3/32; H03G 3/344
See application file for complete search history.

(56) References Cited

U.S. PATENT DOCUMENTS

| | | | |
|---|---|---|---|
| 6,805,633 B2 | 10/2004 | Hein, Jr. et al. | |
| 7,333,618 B2 | 2/2008 | Shuttleworth et al. | |
| 8,184,824 B2 | 5/2012 | Hettinger et al. | |
| 9,698,745 B2 | 7/2017 | Bharj et al. | |
| 2009/0290721 A1* | 11/2009 | Goldstein ............ | H04R 1/1041 381/74 |
| 2011/0301728 A1* | 12/2011 | Hamilton ............. | G11B 27/034 700/94 |
| 2016/0073153 A1* | 3/2016 | Hou ...................... | H04N 21/439 725/10 |

(Continued)

*Primary Examiner* — Regina N Holder
(74) *Attorney, Agent, or Firm* — Womble Bond Dickinson (US) LLP

(57) ABSTRACT

An audio system having a variable reset volume, and a method of conditionally resetting a volume parameter, are described. The audio system can include a processor to generate an audio signal for a speaker to convert into a sound. A volume parameter of the audio signal can be set before a user pauses playback of the audio signal. The processor can determine that the volume parameter is outside of a resting volume range, and that the user resumes playback of the audio signal at least a selected interval after pausing playback. The processor can responsively reset the volume parameter when playback is resumed to a different level based on one or more acoustic factors, such as an audio decay time of a surrounding environment. The different level can be within the resting volume range. Other aspects are also described and claimed.

21 Claims, 6 Drawing Sheets

(56) References Cited

U.S. PATENT DOCUMENTS

2016/0103653 A1* 4/2016 Jang ................... G06F 3/165
                                                    381/107
2016/0173808 A1* 6/2016 Reams ................ G10L 19/028
                                                    348/738

* cited by examiner

AUDIO SYSTEM HAVING VARIABLE RESET VOLUME

This application claims the benefit of U.S. Provisional Patent Application No. 62/593,158, filed on Nov. 30, 2017, which is incorporated herein by reference in its entirety.

BACKGROUND

Field

Aspects related to audio systems, are disclosed. More particularly, aspects related to audio systems having volume controls, are disclosed.

Background Information

Speakers are used by computers or home electronics to output sound to a listening area. A speaker array can output sound to the listening area at a user-controlled volume. The speaker may be a component of a personal device or a communal device, and may be used to play back music at different times by a same user or different users. For instance, a first user may be listening to music at a high volume at a first time, and may pause the music before leaving the listening area. A second user may subsequently enter the listening area, and may resume the music expecting the volume to be set at a lower level than the high level. The second user may be startled and disappointed when music playback resumes at the high volume instead.

SUMMARY

An audio system having a variable reset volume, and a method of conditionally resetting a volume parameter, are described. In an aspect, the audio system has a speaker and a processor configured to perform the method. For example, the processor can execute instructions stored on a non-transitory machine readable medium to cause the audio system to perform the method of conditionally resetting the volume parameter for playback of sound by the speaker. The processor can determine whether the volume parameter is set to a first volume level outside of a resting volume range when audio signal generation is paused, e.g., when a user presses "pause" on the audio system. When the audio signal generation is resumed, e.g., when the user presses "play" on the audio system, the processor can set the volume parameter to a second volume level. The second volume level can be the same or different than the first volume level depending on conditions that exist after playback was paused.

In an aspect, the second volume level is the same as the first volume level. For example, when the play command is entered less than a selected interval after the pause command, the processor can set the second volume level to a same level as the first volume level. The reset value can be the same as the first volume level regardless of whether the first volume level is within or outside of the resting volume range.

In an aspect, the second volume level is different than the first volume level. For example, when the play command is entered more than a selected interval after the pause command, and the first volume level is outside of the resting volume range, the processor can set the second volume level to a different level than the first volume level, e.g., within the resting volume range. Similarly, when the first volume level is at a mute level outside of the resting volume range, the processor can set the second volume level to a different level than the first volume level, e.g., above the mute level. The reset level may be based on acoustic factors that exist after playback is paused. For example, the processor may determine the reset level based on an audio decay time of a surrounding environment, a room gain of the audio system, or a time of day when playback is resumed. Accordingly, the processor can intelligently reset a resting volume of the audio system to provide an audible and comfortable listening experience to a user that resumes the playback.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
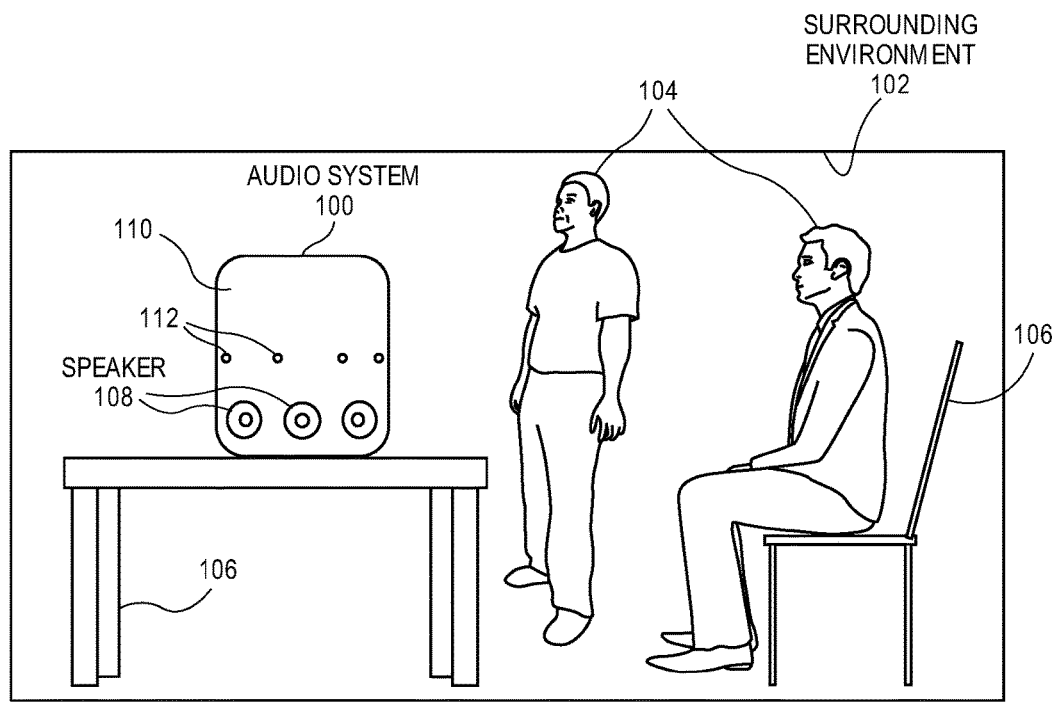
FIG. 1 is a pictorial view of an audio system within a listening area, in accordance with an aspect.

Aspects describe an audio system having a variable reset volume, and a method of conditionally resetting a volume parameter. The audio system may be a standalone audio system, such as a smart speaker. The audio system may, however, be incorporated into other applications, such as a computer system (desktop computer, laptop computer, tablet computer, mobile device, wearable computer, etc.), a motor vehicle, or an aircraft, to name only a few possible applications.

In various aspects, description is made with reference to the figures. However, certain aspects may be practiced without one or more of these specific details, or in combination with other known methods and configurations. In the following description, numerous specific details are set forth, such as specific configurations, dimensions, and processes, in order to provide a thorough understanding of the aspects. In other instances, well-known processes and manufacturing techniques have not been described in particular detail in order to not unnecessarily obscure the description. Reference throughout this specification to "one aspect," "an aspect," or the like, means that a particular feature, structure, configuration, or characteristic described is included in at least one aspect. Thus, the appearance of the phrase "one aspect," "an aspect," or the like, in various places throughout this specification are not necessarily referring to the same aspect. Furthermore, the particular features, structures, configurations, or characteristics may be combined in any suitable manner in one or more aspects.

The use of relative terms throughout the description may denote a relative position or direction. For example, "in front of" may indicate a first direction away from a reference point. Similarly, "behind" may indicate a location in a second direction away from the reference point and opposite to the first direction. Such terms are provided to establish relative frames of reference, however, and are not intended to limit the use or orientation of an audio system to a specific configuration described in the various aspects below.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

In an aspect, an audio system sets a resting volume level after a selected time has elapsed following a pause in playback of an audio signal. The resting volume level can be automatically adjusted to a comfortable and audible level based on one or more acoustic factors within an environment surrounding the audio system. For example, when playback is resumed after the selected time has elapsed, and a room gain of the audio system is low due to a crowd of people gathering in the surrounding environment for a party, the resting volume level may be set to a relatively high level, e.g., 60% of full scale volume. By contrast, when playback is resumed after the selected time has elapsed, and the room gain is high due to the surrounding environment having few people early in the morning, the resting volume level may be set to a relatively low volume, e.g., 30% of full scale volume. Accordingly, the audio system can have a variable and "smart" reset volume that is intelligently determined based on factors such as audio decay time of the surrounding environment, a number of people in the surrounding environment, a time of day, etc.

Referring to FIG. 1, a pictorial view of an audio system within a listening area is shown in accordance with an aspect. An audio system 100 may operate within a surrounding environment 102. Surrounding environment 102 may be a listening environment, such as a room, where one or more people 104 listen to sounds played by audio system 100. For example, a number of people 104 may gather in surrounding environment 102 to listen to music played by audio system 100. Other objects, such as furniture 106, can occupy surrounding environment 102. People 104 and furniture 106 can affect the acoustics of surrounding environment 102. The acoustics and/or placement of audio system 100 within surrounding environment 102 can affect a room gain of audio system 100.

Audio system 100 may include an audio receiver (FIG. 2), and one or more speakers 108 used to convert an audio signal into a sound. For example, the audio receiver can be coupled to a speaker array having several speakers 108 located around an outer surface of the housing 110. The audio receiver may include a processor configured to generate the audio signal, and the processor can output the audio signal to speaker(s) 108 for sound playback. The processor may generate the audio signal having a volume parameter, and the processor may set the volume parameter based on inputs received by the processor. For example, audio system 100 can include one or more microphones 112 coupled to the processor to receive sound reflected back from objects in surrounding environment 102. The processor can adjust the volume parameter based on the microphone inputs, or based on any other inputs provided by audio system components.

Figure 2:
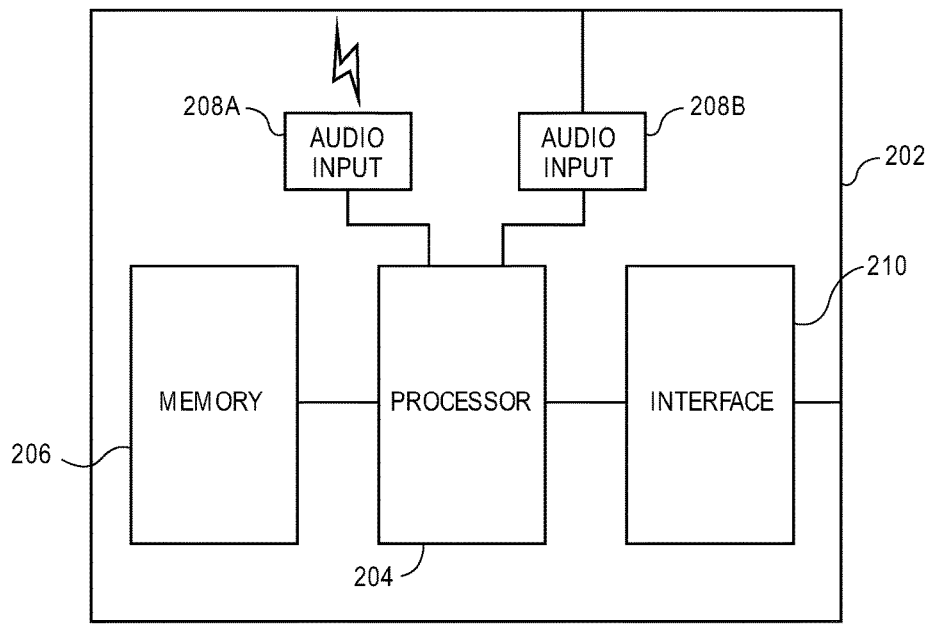
FIG. 2 is a block diagram of an audio receiver of an audio system, in accordance with an aspect.

Referring to FIG. 2 a block diagram of an audio receiver of an audio system is shown in accordance with an aspect. Audio receiver 202 may be an electronic device capable of driving one or more speakers 108 in the loudspeaker array. For example, audio receiver 202 may be integrated within housing 110 of audio system 100. Alternatively, audio receiver 202 may be an external receiver, such as a desktop computer, a laptop computer, a tablet computer, a home theater receiver, a set-top box, and/or a mobile device such as a smartphone. Audio receiver 202 can include a processor 204 and a memory unit 206. Processor 204 and memory unit 206 may be any suitable combination of programmable data processing components and data storage that conduct the operations needed to implement the various functions and operations of audio receiver 202. Processor 204 can be an applications processor, and memory unit 206 can be a microelectronic, non-volatile random-access memory. An operating system may be stored in memory unit 206 along with application programs specific to the various functions of audio receiver 202, which are to be run or executed by processor 204 to perform the various functions of audio receiver 202. More particularly, memory unit 206 may include a non-transitory machine-readable medium storing instructions, which when executed by processor 204, cause audio system 100 to perform any of the various methods described below.

Audio receiver 202 may include one or more audio inputs 208 configured to receive audio signals 208 from an external device, e.g., a remote device. For example, audio receiver 202 may receive audio signals from a remote server of a streaming media service. The audio signals 208 may represent one or more channels of a piece of sound program content, e.g., a musical composition or an audio track for a movie. For example, a single signal corresponding to a single channel of a piece of multichannel sound program content may be received by audio input 208A via a wireless connection or audio input 208B via a wired connection. In another example, a single signal may correspond to multiple channels of a piece of sound program content, which are multiplexed onto the single signal. Processor 204 of audio receiver 202 may receive as inputs multiple audio channel signals simultaneously, and may process these to produce several acoustic transducer drive signals to render the audio content in the input signals a sound.

In an aspect, audio receiver 202 may include a digital audio input that receives digital audio signals from an external device and/or a remote device. For example, audio input 208 A,B may be a TOSLINK connector or a digital wireless interface, e.g., a wireless local area network (WLAN) adapter or a Bluetooth adapter. Audio receiver 202 may include an analog audio input that receives analog audio signals from an external device. For example, audio input may include a binding post, a phono plug, etc., which is designed to receive a wire or conduit and a corresponding analog signal. In an aspect, processor 204 may obtain input audio channel signals by decoding an encoded audio file, e.g., an MPEG file.

Audio receiver 202 may include one or more audio inputs configured to receive audio signals from another component of audio system 100. For example, audio receiver 202 may receive audio signals from one or more microphones 112 coupled to audio input 208B. The audio signals may represent sound reflected to audio system 100 from surrounding environment 102. Processor 204 of audio receiver 202 may receive and process these input signals to determine acoustic factors of surrounding environment 102, e.g., a size of the room, a placement of audio system 100 within the room, a number or placement of people 104 in the room, a number or placement of furniture 106 or decorations within the room, a noise level originating from people 104 within surrounding environment 102, etc.

Audio receiver 202 may include an interface 210 for communicating with speaker 108. Interface 210 may use wired mediums, e.g., conduit or wire, to communicate with speaker 108. In another aspect, audio receiver 202 may be external to audio system 100, and interface 210 may communicate with speaker 108 through a wireless connection. For example, network interface 210 may utilize one or more wireless protocols and standards for communicating with speaker 108, including the IEEE 802.11 suite of standards, IEEE 802.3, cellular Global System for Mobile Communications (GSM) standards, cellular Code Division Multiple Access (CDMA) standards, Long Term Evolution (LTE) standards, and/or Bluetooth standards.

Figure 3:
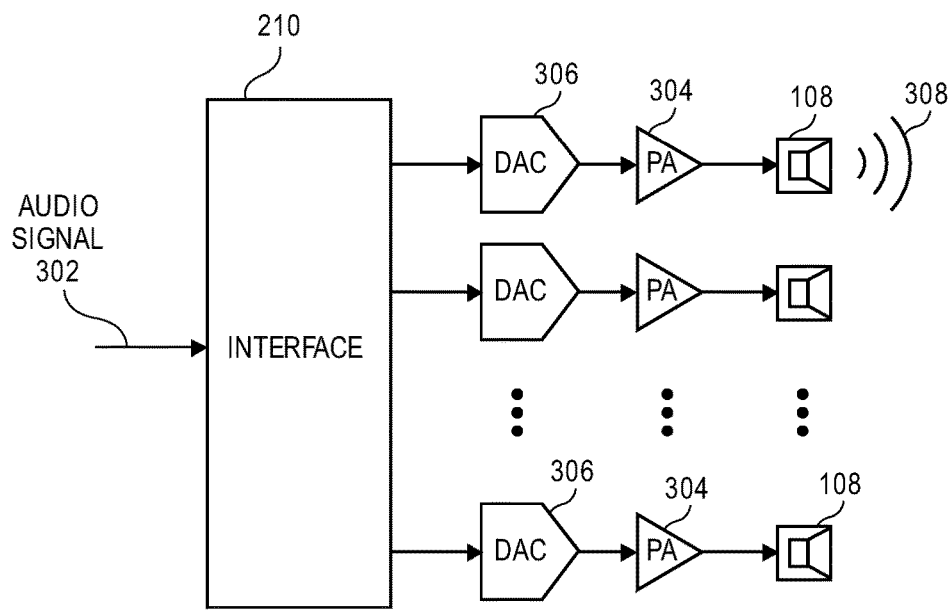
FIG. 3 is a block diagram of a speaker array of an audio system, in accordance with an aspect.

Referring to FIG. 3 a block diagram of a speaker array of an audio system is shown in accordance with an aspect. Interface 210 may receive an audio signal 302 from processor 204 of audio receiver 202 to drive speakers 108 of the loudspeaker array. More particularly, interface 210 can provide the drive signals as audio signals to drive each speaker 108. Audio system 100 may include power amplifiers (PAs) 304 for amplifying drive signals sent to each of speakers 108 of audio system 100. Audio system 100 may include digital-to-analog converters (DACs) 306 for converting the drive signals from the digital domain into the analog domain. PAs and DACs can be integrated into housing 110 of audio system 100. Accordingly, audio signal 302 generated by processor 204 can be provided to speaker 108 to convert audio signal 302 into a sound 308.

Figure 4:
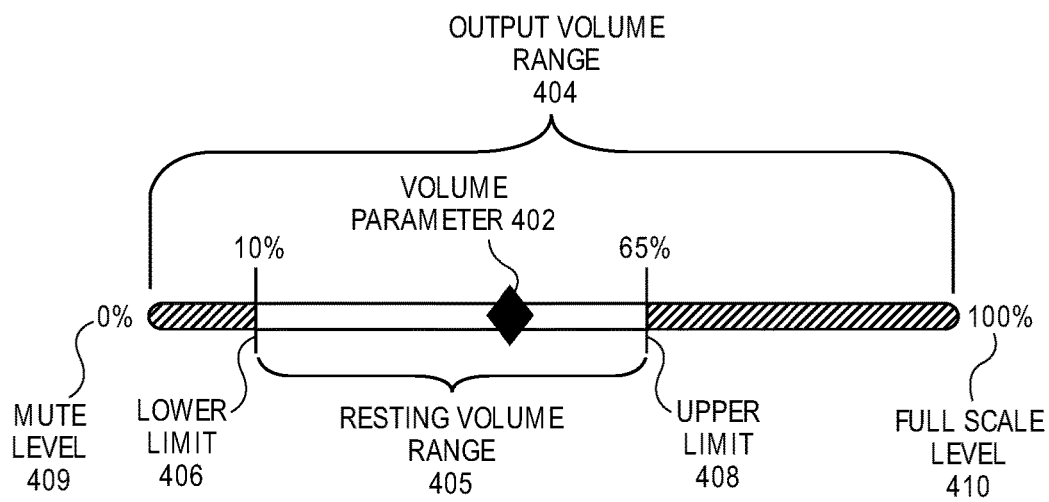
FIG. 4 is a pictorial view of a volume control scheme of an audio system, in accordance with an aspect.

Referring to FIG. 4 a pictorial view of a volume control scheme of an audio system is shown in accordance with an aspect. Processor 204 can generate audio signal 302 having a volume parameter 402. For example, volume parameter 402 may be an amplitude of audio signal 302, or data encoded in audio signal 302 representing an amplification value or playback volume for sound 308. Speaker 108 may output sound 308 at a volume corresponding to volume parameter 402. The output volume of sound 308 may be represented on an output volume range 404. Output volume range 404 may be a full-scale range of a sound output capability of speaker 108. More particularly, output volume range 404 may be a range between a mute level 409 when speaker 108 has 0% output and is not emitting sound 308, to a full scale level 410 when speaker 108 has 100% output and is emitting sound 308 at a maximum capability.

A user may enter a command (e.g., physical or voice) to set volume parameter 402 at any level within output volume range 404. For example, the user may physically manipulate a volume-up or a volume-down control (e.g., a button) located on housing 110, a remote control, or a remote smartphone display. The physical command entered by the user can send a command signal to processor 204 to raise or lower volume parameter 402 of audio signal 302 within output volume range 404.

Volume parameter 402 may be set within a resting volume range 405 of output volume range 404. Resting volume range 405 may be a selected subrange of the full scale volume range. For example, resting volume range 405 may extend from a lower limit 406 having a selected value higher than mute level 409, e.g., 10% of full scale level 410, to an upper limit 408 having a selected value lower than full scale level 410, e.g., 65% of full scale level 410. The lower limit and upper limit presets may be selected to provide a comfortable range of volume to a user that resumes playback without knowledge of a volume setting when playback was paused. For example, resting volume range 405 may provide sound output that is both audible and not jarring when playback is resumed.

A typical use case is described here to preface the more detailed examples described below. A user may start playback of music and set volume parameter 402 to a level that is outside of resting volume range 405. For example, the user may set volume parameter 402 below lower limit 406 when studying late at night or above upper limit 408 when exercising in the morning. The user may pause playback, e.g., after studying or exercising, and leave the room. Alternatively, the user may adjust volume parameter 402 outside of resting volume range 405 after playback is already paused, and then leave the room. After a selected time interval, e.g., an hour, the same user or another user may enter the room and provide a play command to resume playback of music. Processor 204 may automatically reset volume parameter 402 to a level within resting volume range 405 to play sound 308 that is not too low (in the case of the previous playback being below lower limit 406) or too high (in the case of the previous playback being above upper limit 408). The reset level for volume parameter 402 may be a selected level, e.g., 30% when the previous playback is below lower limit 406 or 65% when the previous playback is above upper limit 408. Volume parameter 402 may be reset and "rest" at the reset level at any time after the selected time interval until playback is resumed.

Figure 5:
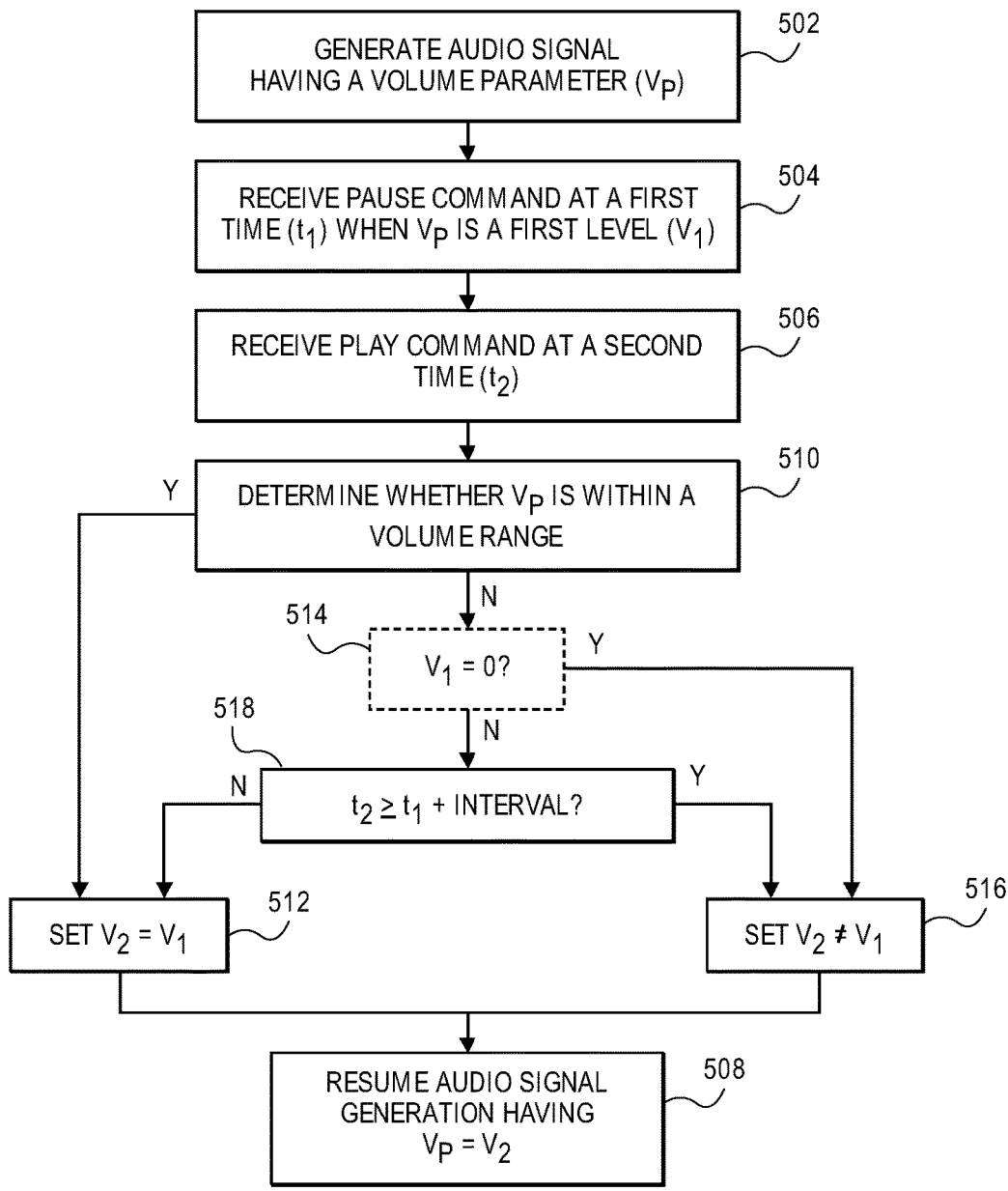
FIG. 5 is a flowchart of a method of conditionally resetting a volume parameter of an audio system, in accordance with an aspect.

Referring to FIG. 5 a flowchart of a method of conditionally resetting a volume parameter 402 of an audio system 100 is shown in accordance with an aspect. Resetting volume parameter 402 to rest at a selected reset level may not suit all instances of playback resumption. For instance, resetting volume parameter 402 to a resting level of 30% when the previous playback is below the lower limit 406 may not be suitable when playback is resumed during a party with many people present. Similarly, resetting volume parameter 402 to a resting level of 65% may not be suitable when playback is resumed when a sleeping baby is in the room. More particularly, the selected reset level may be too loud or too quiet for the circumstances existing when playback is resumed. Accordingly, processor 204 may intelligently determine and set the reset level based on conditions existing after the selected time interval, e.g., when playback is resumed, as described below.

At operation 502, processor 204 of audio system 100 generates audio signal 302 having volume parameter 402. Audio signal 302 may be reproduced for listening by people 104 in surrounding environment 102. At operation 504, a user may provide a pause command at a first time. Processor 204 can receive the pause command, and in response, pause audio signal generation at the first time. When the pause command is received, volume parameter 402 may be set to a first volume level, which may be inside or outside of resting volume range 405.

At operation 506, the same user or a different user may provide a play command at a second time after the first time. Processor 204 can receive the play command, and in response, resume audio signal generation. Prior to resuming audio playback, however, processor 204 can set volume parameter 402 to an appropriate level based on one or more acoustic factors existing at the second time. In other words, processor 204 may perform several logical operations (between operation 506 and operation 508) to conditionally reset volume parameter 402 to a second volume level either before or at the second time. At operation 508, processor 204 may resume audio signal generation at the second time, and the resumed audio signal 302 can have volume parameter 402 equal to the second volume level.

At operation 510, as a condition to resetting volume parameter 402, processor 204 can determine whether volume parameter 402 is set to a first volume level within a volume range. Processor 204 can determine whether volume parameter 402 is outside of resting volume range 405. The determination may be made when audio signal generation is paused. For example, the determination may be made at the first time when the pause command is received, or subsequently after a selected interval has passed.

The determination of whether volume parameter 402 is within resting volume range 405 can be a first condition to determine the reset level for volume parameter 402. For example, at 512, when volume parameter 402 is determined to be within resting volume range 405 at the first time, the second volume level may be set equal to the first volume level of volume parameter 402 when playback was paused. The second volume level can be within resting volume range 405 regardless of any other conditions. For example, the second volume level can be within resting volume range 405 regardless of a time difference between a second time when audio signal generation is resumed, and the first time when audio signal generation was paused. Processor 204 may then set volume parameter 402 to a second volume level within resting volume range 405 and resume audio signal generation at operation 508.

When processor 204 determines that volume parameter 402 is not within resting volume range 405 at the first time, processor 204 may determine, as a condition to resetting volume parameter 402, whether sound reproduction was muted when audio playback was paused. More particularly, at operation 514, processor 204 can determine whether the first volume level of volume parameter 402 was equal to mute level 409 when playback was paused. At operation 516, when the first volume level is at mute level 409, processor 204 can reset the second volume level to a level that is different than the first volume level when playback was paused. The second volume level can be different than mute level 409 regardless of any other conditions. For example, the second volume level can be different than the first volume level regardless of the time difference between a second time when audio signal generation is resumed, and the first time when audio signal generation was paused. Processor 204 may then resume audio signal generation at operation 508.

Operation 514 is optionally included to address a special use case. More particularly, resetting volume parameter 402 to a level higher than mute level 409 addresses the case where the user mutes and then pauses audio playback (or vice versa). The mute/pause sequence may be accidental or intentional, however, it is presumed that the same user or a different user wishes to hear sound when resuming playback. Thus, resetting volume parameter 402 to a level different than mute level 409 at operation 516 avoids the confusion that could occur if a user provided a play command expecting to hear sound and instead heard nothing.

At operation 518, when processor 204 determines that volume parameter 402 is not set to mute level 409 at the first time, processor 204 may determine whether the second time (when audio signal generation is resumed) is more than a selected interval after the first time (when audio signal generation is paused). The selected interval can be an interval that corresponds to an amount of time over which the resting volume adjustment should start. For example, the selected interval may be one hour, which may correspond to an amount of time over which either the user who paused music playback has transitioned behaviors, e.g., stopped exercising and engaged in a phone call, or over which another user has entered the room and resumed music playback. The interval may be set as a timer within the instructions executed by processor 204.

In an aspect, when processor 204 determines that the second time is within the selected interval after the first time, the second volume level may be set equal to the first volume level (operation 512). More particularly, processor 204 may set the second volume equal to the first volume in response to the second time being less than the selected interval after the first time. This non-adjustment, i.e., not changing the level of volume parameter 402, may occur regardless of whether the first volume level is outside of resting volume range 405. More particularly, when playback is resumed, processor 204 may reset volume parameter 402 to a different level only when either the first volume level is at mute level 409 or the play command is received only after a selected interval has lapsed following the pause command.

At operation 516, when processor 204 determines that the first volume level is outside of resting volume range 405 (operation 510), the first volume level is not mute level 409 (operation 514), and the second time is more than the selected interval after the first time, processor 204 can reset the second volume level to a level that is different than the first volume level. Processor 204 may then resume audio signal generation at operation 508.

In an aspect, when processor 204 resets volume parameter 402 to the second volume level different than the first volume level, the second volume level is based on one or more acoustic factors. The acoustic factors may exist at the second time when audio signal generation is resumed. Adjusting the reset volume based on the acoustic factors can provide a dynamically determined reset value that is audible and comfortable for the user. For example, the acoustic factors that are used as inputs to determine the second volume level of volume parameter 402 can include parameters corresponding to surrounding environment 102 or objects contained therein, parameters corresponding to audio system 100, parameters corresponding to the circumstances existing when audio playback is resumed, and/or any other suitable factors.

In an aspect, processor 204 resets volume parameter 402 based on acoustic factors corresponding to surrounding environment 102. Determination of a reset value for volume parameter 402 may depend on a reverberation of sound produced by audio system 100 in surrounding environment 102. For example, the one or more acoustic factors may include an audio decay time of surrounding environment 102. The audio decay time may be a $T_{60}$ of the sound produced by audio system 100, which can be defined as the time required for reflections of the sound 308 to decay 60 dB within surrounding environment 102. Processor 204 can automatically detect the audio decay time by outputting sound 308 using speaker 108 and monitoring the sound reflections using microphone 112. When the audio decay time of surrounding environment 102 is high, it can indicate a large room and/or low absorption within the room (e.g., a sparsely populated room). Accordingly, processor 204 may reset volume parameter 402 to a lower setting, such as between lower limit 406 and a midpoint of resting volume range 405. By contrast, when the audio decay time of surrounding environment 102 is low, it can indicate a small room and/or high absorption within the room (e.g., a crowded room). Accordingly, processor 204 may reset volume parameter 402 to a higher setting, such as between the midpoint of resting volume range 405 and upper limit 408.

In another aspect, a room gain of audio system 100 corresponds to the audio decay time of sound 308 generated by speaker 108 and may be calculated as $T_{60}$ divided by the sound volume. Accordingly, one or more acoustic factors can include the room gain of audio system 100, and like the dependence on audio decay time, the second volume level of volume parameter 402 may be inversely proportional to the room gain. In other words, if audio system 100 is in a room that has high room gain, the reset value of volume parameter 402 may be set closer to lower limit 406 than if audio system 100 is in a room that has less room gain. Although the room gain is directly proportional to the audio decay time and can be measured accordingly, factors influencing room gain may be detected or measured separately.

Room gain of audio system 100 can be influenced by a size of surrounding environment 102. Accordingly, the one or more acoustic factors used to determine the reset value for volume parameter 402 may include the size of surrounding environment 102, e.g., a volume of the room. The room size may be selected from a user interface during an initial setup of audio system 100. For example, a user may make a selection of "small room," "medium room," or "large room," or may enter one or more of width, height, or length dimensions of the room into the user interface.

Room gain of audio system 100 can be influenced by an amount of acoustic absorption within surrounding environment 102. Accordingly, the one or more acoustic factors used to determine the reset value for volume parameter 402 may include information about the objects within surrounding environment 102. For example, an acoustic factor may include a number of objects, e.g., people 104, furniture 106, or decorations, located within surrounding environment 102. Information about furniture 106 or the decorations may be entered or selected during the initial setup of audio system 100.

In an aspect, the number of users can be detected by audio system 100. One or more of people 104 within surrounding environment 102 may have a mobile device or a wearable computer on their person that is detectable through a wireless local area network or a personal area network. For example, audio system 100 and the mobile devices of the users can be running a same operating system that provides an ad-hoc service to enable audio system 100 to detect the presence of the mobile devices. Processor 204 of audio system 100 can detect the number of devices, and accordingly, may infer that a same number of people 104 is within surrounding environment 102. The information may be used as one of the acoustic factors in determining the reset value of volume parameter 402. For example, when audio system 100 detects more than a threshold number of people 104 within surrounding environment 102, volume parameter 402 may be reset within an upper half of resting volume range 405. By contrast, when audio system 100 detects fewer than the threshold number of people 104, volume parameter 402 may be reset within a lower half of resting volume range 405.

Audio system 100 can listen to surrounding environment 102 to determine the audio decay time, as described above, or may listen to determine other room characteristics in order to adjust the reset value of volume parameter 402. In an aspect, microphones 112 of audio system 100 can detect noise within surrounding environment 102 to determine whether an atmosphere of the room is noisy or quiet. The noise information may be used as one of the acoustic factors in determining the reset value of volume parameter 402. For example, when audio system 100 detects more than a threshold amount of noise within surrounding environment 102, volume parameter 402 may be reset within an upper half of resting volume range 405. By contrast, when audio system 100 detects less than the threshold amount of noise, volume parameter 402 may be reset within a lower half of resting volume range 405.

Audio system 100 can also detect a relative placement between speakers and external surfaces. The relative placement can be a factor in determining the reset value for volume parameter 402. For example, when audio system 100 is placed near a wall, the room gain of audio system 100 may increase. Accordingly, audio system 100 may emit and receive acoustic signals to detect whether a wall of surrounding environment 102 is nearby. When processor 204 determines that audio system 100 is near a wall, e.g., in a corner of surrounding environment 102, volume parameter 402 may be reset based on the room gain. More particularly, when audio system 100 is not near the wall, e.g., more than a selected distance from the wall, volume parameter 402 may be reset within an upper half of resting volume range 405. By contrast, when audio system 100 is near the wall, e.g., within the selected distance from the wall, volume parameter 402 may be reset within a lower half of resting volume range 405. Similar adjustments may be made based on detection of a proximity of people 104 to audio system 100. Audio system 100 may emit and/or monitor acoustic signals directed at nearby people 104 to determine whether people 104 are close to audio system 100. When audio system 100 is not near people 104, e.g., more than a selected distance from people 104, volume parameter 402 may be reset within an upper half of resting volume range 405. By contrast, when audio system 100 is near people 104, e.g., within the selected distance from people 104, volume parameter 402 may be reset within a lower half of resting volume range 405.

Processor 204 can utilize other acoustic factors to determine the reset value for volume parameter 402. By way of example, processor 204 can set volume parameter 402 to the second volume level based in part on a time of day. When audio playback is resumed during nighttime hours, e.g., between 9 p.m. and 6 a.m. local time, it may be presumed that audio system 100 is being used during quiet hours. Accordingly, volume parameter 402 may be reset within a lower half of resting volume range 405, e.g., between 25-35% of full scale volume. By contrast, when audio system 100 detects that audio playback is resumed during daytime hours, volume parameter 402 may be reset within an upper half of resting volume range 405, e.g., between 50-60% of full scale. Processor 204 can set nighttime and daytime hour ranges during an initial setup by a user.

Processor 204 can determine the reset value of volume parameter 402 based on one or more of the factors described above. For example, processor 204 may combine information about the time of day and the noise within surrounding environment 102 to determine whether audio system 100 is truly being used in a quiet-time scenario. By way of example and not limitation, when processor 204 detects that playback is resumed during nighttime hours but the room is noisy, it may assume that a party is happening and volume parameter 402 may be reset within the upper half of resting volume range 405. Combinations of acoustic factor inputs to determine a volume parameter output may be performed through weighting of factors, logical operations, etc.

Setting volume parameter 402 to the second volume level different than the first volume level may involve setting volume parameter 402 within resting volume range 405. Examples of the second volume level being within resting volume range 405 are described further with respect to FIGS. 6 and 8-10 below. The reset value need not be within resting volume range 405, however. In an aspect, volume parameter 402 is set to the second volume level different than the first volume level and outside of resting volume range 405. Examples of the second volume level being outside of resting volume range 405 are described further with respect to FIGS. 7 and 10 below.

Figure 6:
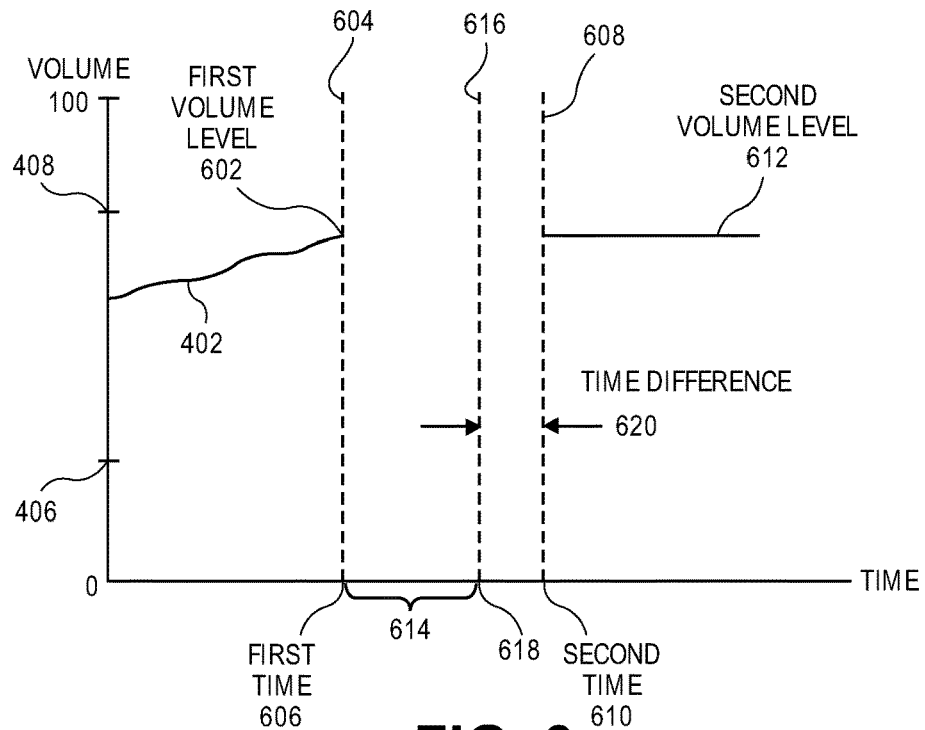
FIGS. 6-10 are visual representations of volume parameters being reset to various levels under respective conditions, in accordance with an aspect.

Referring to FIG. 6, a visual representation of a volume parameter being reset to a level when the first volume level is within resting volume range 405 is shown in accordance with an aspect. Processor 204 of audio system 100 generates audio signal 302 having volume parameter 402 (operation 502). Volume parameter 402 may begin between lower limit 406 and upper limit 408, and may be gradually or immediately increased to a first volume level 602. A user may provide a pause command 604 at a first time 606 (operation 504). Processor 204 can receive the pause command 604, and in response, pause audio signal generation at first time 606.

The same user or a different user may provide a play command 608 at a second time 610 after first time 606 (operation 506). Prior to resuming audio playback, processor 204 can set volume parameter 402 to an appropriate level based on one or more acoustic factors existing at second time 610. Processor 204 can determine whether first volume level 602 is outside of resting volume range 405 (operation 510). In the example of FIG. 6, first volume level 602 is within resting volume range 405. Accordingly, processor 204 may set volume parameter 402 to a second volume level 612 within resting volume range 405, e.g., equal to first volume level 602 (operation 512).

The second volume level 612 can be set within resting volume range 405 regardless of a relationship between second time 610 and a selected interval 614 after first time 606. The selected interval 614 may be monitored by a timer of processor 204, and a timeout signal 616 may be registered by processor 204 when the selected interval 614 expires at a timeout time 618. In any case, there may be a time difference 620 between timeout time 618 when the timer expires and second time 610 when playback resumes. The time difference 620 may be positive (second time 610 follows timeout time 618) or negative (timeout time 618 follows second time 610). When first volume level 602 at first time 606 is within resting volume range 405, however, second volume level 612 can be within resting volume range 405 regardless of whether time difference 620 is positive or negative. Audio generation may be resumed at second time 610 with volume parameter 402 set to second volume level 612 (operation 508).

Figure 7:
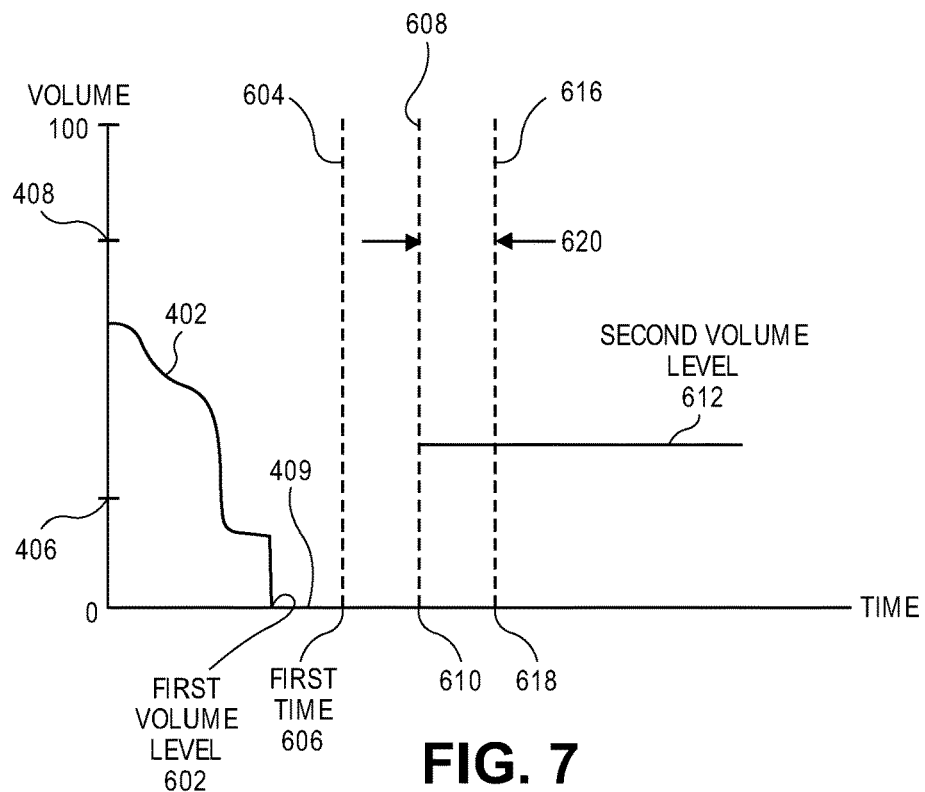

Referring to FIG. 7, a visual representation is shown of a volume parameter 402 being reset to a level when the first volume level 602 is mute level 409 and the second time 610 is during the selected interval 614 after the first time 606. Processor 204 of audio system 100 generates audio signal 302 having volume parameter 402 (operation 502). Volume parameter 402 may begin between lower limit 406 and upper limit 408, and may be gradually or immediately decreased to a level outside of resting volume range 405. For example, first volume level 602 may be below lower limit 406, e.g., at mute level 409, when a user provides pause command 604 at first time 606 (operation 504). Processor 204 can receive the pause command 604, and in response, pause audio signal generation at first time 606.

The same user or a different user may provide a play command 608 at second time 610 after first time 606 (operation 506). Prior to resuming audio playback, processor 204 can set volume parameter 402 to an appropriate level based on one or more acoustic factors existing at second time 610. Processor 204 can determine whether first volume level 602 is outside of resting volume range 405 (operation 510). In the example of FIG. 7, first volume level 602 is outside of resting volume range 405. Accordingly, processor 204 may proceed to determine whether audio playback was paused when sound 308 reproduction was muted (operation 514). In the example of FIG. 7, first volume level 602 is equal to mute level 409 at first time 606. When the first volume level 602 is mute level 409, processor 204 can reset second volume level 612. More particularly, processor 204 can reset second volume level 612 of volume parameter 402 to a level that is different than first volume level 602 when playback was paused (operation 516). Second volume level 612 can be different than mute level 409 regardless of whether time difference 620 is positive or negative (it is negative in FIG. 7). Audio generation may be resumed at second time 610 with volume parameter 402 set to second volume level 612 (operation 508).

Figure 8:
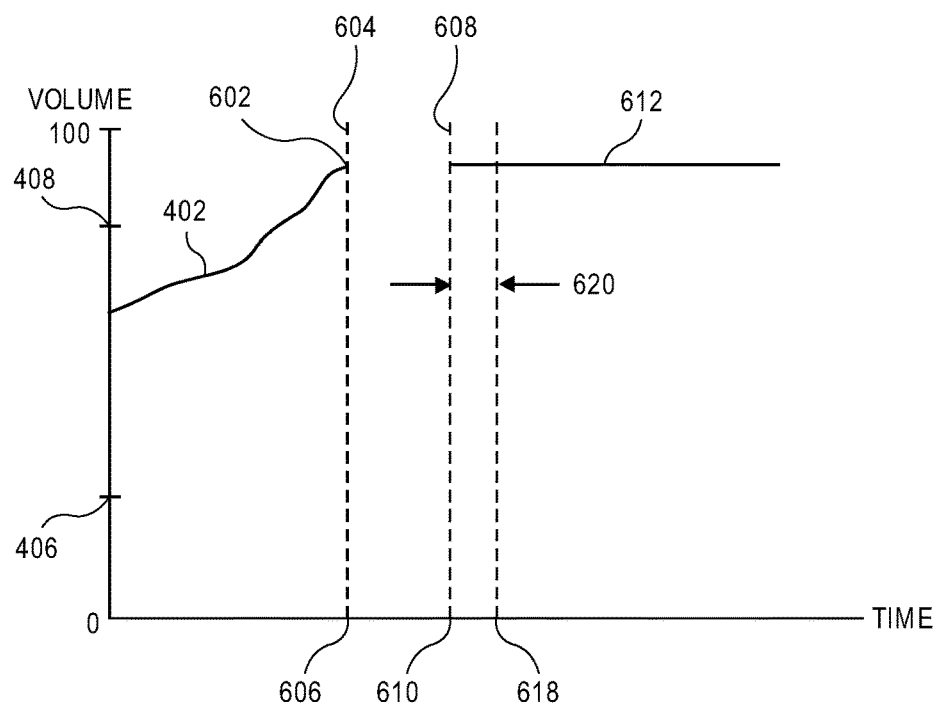

Referring to FIG. 8, a visual representation is shown of a volume parameter 402 being reset to a level when the first volume level 602 is outside of resting volume range 405 and the second time 610 is less than the selected interval 614 after the first time 606. Processor 204 of audio system 100 generates audio signal 302 having volume parameter 402 (operation 502). Volume parameter 402 may begin between lower limit 406 and upper limit 408, and may be gradually or immediately increased to a level outside of resting volume range 405. For example, first volume level 602 may be above upper limit 408 when a user provides pause command 604 at first time 606 (operation 504). Processor 204 can receive the pause command 604, and in response, pause audio signal generation at first time 606.

The same user or a different user may provide a play command 608 at second time 610 after first time 606 (operation 506). Prior to resuming audio playback, processor 204 can set volume parameter 402 to an appropriate level based on one or more acoustic factors existing at second time 610. Processor 204 can determine whether first volume level 602 is outside of resting volume range 405 (operation 510). In the example of FIG. 8, first volume level 602 is outside of resting volume range 405. Accordingly, processor 204 may optionally proceed to determine whether sound reproduction was muted when audio playback was paused (operation 514). In the example of FIG. 8, first volume level 602 is not muted at first time 606. When processor 204 determines that volume parameter 402 is not set to mute level 409 at the first time 606, processor 204 may determine whether the second time 610 (when audio signal generation is resumed) is more than a selected interval 614 after the first time 606 (when audio signal generation is paused) (operation 518). In other words, processor 204 may determine whether time difference 620 is positive or negative. In an aspect, when processor 204 determines that time difference 620 is negative (second time 610 is before timeout time 618), second volume level 612 may be set equal to first volume level 602 (operation 512). Audio generation may be resumed at second time 610 with volume parameter 402 set to second volume level 612 (operation 508).

Figure 9:
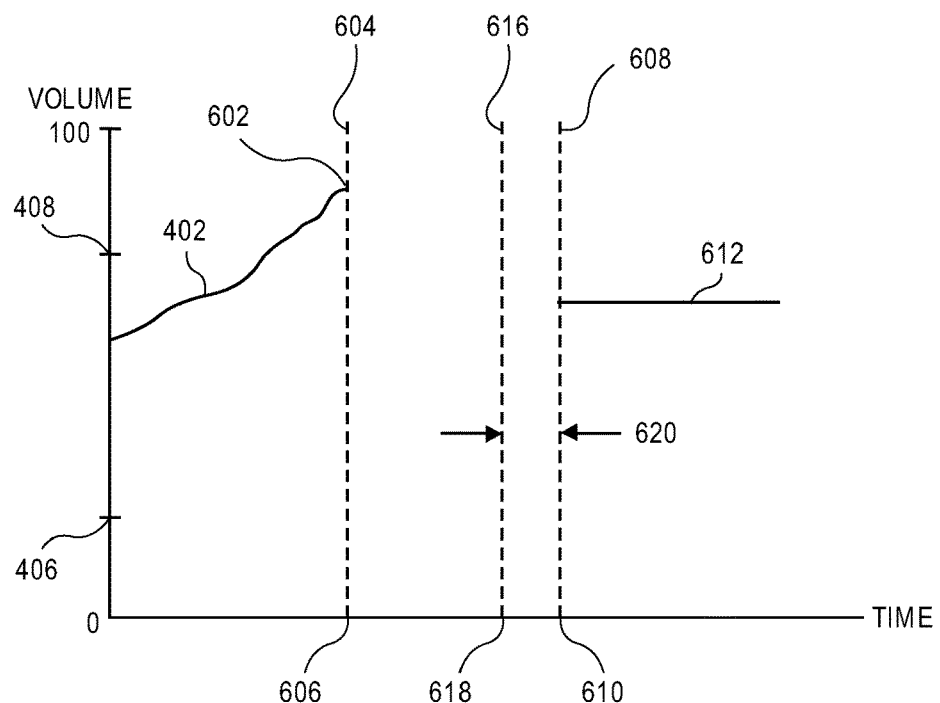

Referring to FIG. 9, a visual representation is shown of a volume parameter 402 being reset to a level when the first volume level 602 is outside of resting volume range 405 and the second time 610 is more than the selected interval 614 after the first time 606. Processor 204 of audio system 100 generates audio signal 302 having volume parameter 402 (operation 502). Volume parameter 402 may begin between lower limit 406 and upper limit 408, and may be gradually or immediately increased to a level outside of resting volume range 405. For example, first volume level 602 may be above upper limit 408 when a user provides pause command 604 at first time 606 (operation 504). Processor 204 can receive the pause command 604, and in response, pause audio signal generation at first time 606.

The same user or a different user may provide a play command 608 at second time 610 after first time 606 (operation 506). Prior to resuming audio playback, processor 204 can set volume parameter 402 to an appropriate level based on one or more acoustic factors existing at second time 610. Processor 204 can determine whether first volume level 602 is outside of resting volume range 405 (operation 510). In the example of FIG. 9, first volume level 602 is outside of resting volume range 405. Accordingly, processor 204 may optionally proceed to determine whether sound reproduction was muted when audio playback was paused (operation 514). In the example of FIG. 9, first volume level 602 is not muted at first time 606. When processor 204 determines that volume parameter 402 is not set to mute level 409 at the first time 606, processor 204 may determine whether the second time 610 (when audio signal generation is resumed) is more than a selected interval 614 after the first time 606 (when audio signal generation is paused) (operation 518). In other words, processor 204 may determine whether time difference 620 is positive or negative. In an aspect, when processor 204 determines that time difference 620 is positive (second time 610 is after timeout time 618), second volume level 612 may be set to a different level than first volume level 602 (operation 516). Audio generation may be resumed at second time 610 with volume parameter 402 set to second volume level 612 (operation 508).

The examples illustrated in FIGS. 6-9 include a reset level for volume parameter 402 that is constant regardless of time difference 620. For example, the reset level may be instantaneously determined at second time 610 based on the acoustic factors existing at second time 610, and therefore a magnitude of time difference 620 may be irrelevant to reset level determined by processor 204 (second volume level 612 can be determined regardless of time difference 620). As another example, the reset level may be determined by processor 204 at timeout time 618 based on the acoustic factors existing at timeout time 618, and second volume level 612 may be set to the reset level when playback is resumed regardless of time difference 620. As described below, however, processor 204 may determine the reset level for second volume level 612 based, at least in part, on time difference 620 between second time 610 and the selected interval 614 after first time 606.

Figure 10:
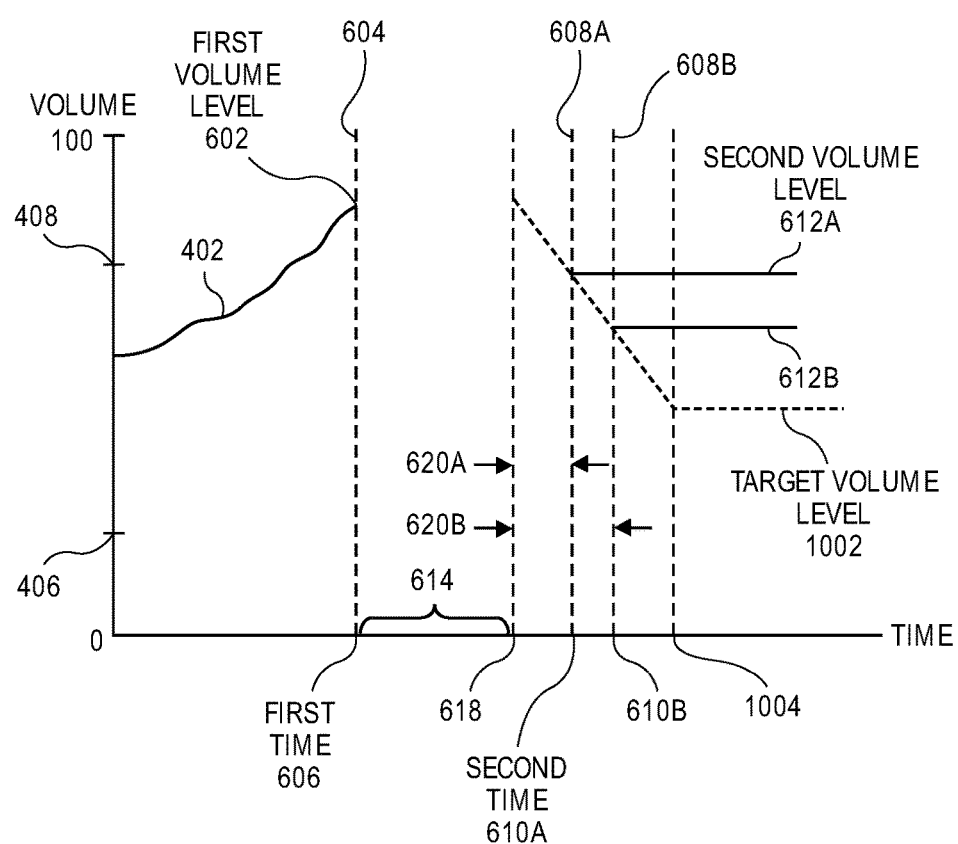

Referring to FIG. 10, a visual representation is shown of a volume parameter 402 being reset to a level when the first volume level 602 is outside of resting volume range 405 and the second time 610 is more than the selected interval 614 after the first time 606. Operations 502, 504, 506, 510, and 514 performed by processor 204 in FIG. 10 are similar to those performed by processor 204 in FIG. 9.

In an aspect, processor 204 can determine a target volume level 1002 when selected interval 614 elapses after first time 606. More particularly, processor 204 can determine target volume level 1002 based on acoustic factors existing at timeout time 618. For example, processor 204 may determine target volume level 1002 based on acoustic factors that are not likely to change over time, e.g., a size of room, a placement of audio system 100 in surrounding environment 102, etc. In the example of FIG. 10, target volume level 1002 may be 50% of full scale volume.

Processor 204 may set second volume level 612 based on time difference 620 between timeout time 618 and second time 610. For example, when time difference 620 is equal to or greater than a time lapse between a target resume time 1004 and timeout time 618, second volume level 612 may be set to target volume level 1002. By contrast, when time difference 620 is less than the time lapse between target resume time 1004 and timeout time 618 (the play command 608 is received between timeout time 618 and target resume time 1004), second volume level 612 may be set to a reset value between first volume level 602 and target volume level 1002. By way of example, when the play command 608 is received at an earlier second time 610A, processor 204 can set second volume level 612A at a higher reset value than a reset value of second volume level 612B when the play command 608 is received at a later second time 610B. In other words, second volume level 612 can be a function of time elapsed after timeout time 618.

The function that relates second volume level 612 to time difference 620 may be linear. As shown in FIG. 10, second volume level 612 decreases linearly from first volume level 602 toward target volume level 1002 over the period of time between timeout time 618 and target resume time 1004. Accordingly, second volume level 612 corresponds to a slope as defined by the difference between first volume level 602 and target volume level 1002 divided by the difference between target resume time 1004 and timeout time 618.

In an aspect, the function that relates second volume level 612 to time difference 620 is non-linear. For example, the reset value may experience exponential decay after timeout time 618 and decrease more rapidly soon after timeout time 618. The decaying reset value may approach and/or equal target volume level 1002 after a selected mean lifetime, e.g., 1 hour.

By reducing the reset value gradually toward target volume level 1002, audio system 100 can balance the need to not startle a different user with the desire to not annoy the user who has only paused music playback briefly, e.g., to take a call. For example, a user may be listening to music when a call is received, and pause music to speak on the phone. The phone call may last 65 minutes—5 minutes longer than a selected interval 614 of 60 minutes—and the user may resume playback immediately after the phone call. If second volume level 612 is instantly reset to target volume level 1002 (FIG. 9) the user may become frustrated that the volume has changed significantly since the last playback session. If, however, second volume level 612 is adjusted gradually, the volume will still be set within the expectation of the user (e.g., may still be outside of resting volume range 405). Furthermore, if the user leaves the room immediately after the phone call and a different user enters a half hour or an hour later and presses play on audio system 100, second volume level 612 would have approached or equaled target volume level 1002 and music playback can begin without startling the different user.

Processor 204 may control audio playback to balance the expectations of different users within a community. As an example, a first user may prefer to play music below lower limit 406, and thus, when the first user pauses music for the selected interval 614, processor 204 may resume playback at a higher level to accommodate the expectations of a second user that prefers to play music within resting volume range 405. In another aspect, processor 204 may make adjustments in a manner that allow a user to override the automatic reset, however. For example, when music playback resumes (operation 508), processor 204 may fade or ramp music playback from first volume level 602 to second volume level 612. The fade-in time or ramp-up time can provide a window for a user, e.g., the first user, to stop the adjustment before the volume level reaches the target reset value. For example, the first user may enter a pause command or a manual or voice entry of a volume level, e.g., may say "pause music"

or "set volume to 20%," before volume parameter 402 of audio signal 302 reaches second volume level 612. Accordingly, the first user can continue to listen at a lower level without having to adjust the volume down from second volume level 612 near a middle of output volume range 404.

As described above, one aspect of the present technology is the gathering and use of data available from various sources to provide a "smart" reset volume that is intelligently determined. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver a "smart" reset volume that is intelligently determined. Accordingly, use of such personal information data enables users to have a properly set volume control. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, a "smart" reset volume can be intelligently determined based on non-personal information data or a bare minimum amount of personal information, such as the content being requested by the device associated with a user, other non-personal information available to the audio system, or publicly available information.

In the foregoing specification, the invention has been described with reference to specific exemplary aspects thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An audio system, comprising:
   a speaker; and
   a processor configured to generate an audio signal having a volume parameter, wherein the processor is configured to:
   determine whether the volume parameter is set to a first volume level outside of a subrange of a full scale volume range when the audio signal generation is paused at a first time,
   set the volume parameter to a second volume level when the audio signal generation is resumed at a second time, wherein the second volume level is different than the first volume level and is based on one or more acoustic factors existing at the second time in response to the first volume level being outside of the subrange at the first time and in response to the second time being more than a selected interval after the first time, and
send the audio signal to the speaker for conversion into sound.

2. The audio system of claim 1, wherein the processor is configured to:
pause the audio signal generation at the first time in response to receiving a pause command; and
resume the audio signal generation at the second time in response to receiving a play command.

3. The audio system of claim 1, wherein the second volume level is within the subrange regardless of a time difference between the second time and the first time.

4. The audio system of claim 1, wherein the second volume level is based on a time difference between the second time and the selected interval after the first time.

5. The audio system of claim 1, wherein the one or more acoustic factors include an audio decay time of a surrounding environment.

6. The audio system of claim 5, wherein the one or more acoustic factors include a number of people in the surrounding environment.

7. The audio system of claim 1, wherein the one or more acoustic factors include a time of day.

8. The audio system of claim 1, wherein the second volume level is the same as the first volume level in response to the second time being less than the selected interval after the first time regardless of whether the first volume level is outside of the subrange, and wherein the second volume level is different than the first volume level in response to the first volume level being a mute level regardless of whether the second time is more than the selected interval after the first time.

9. A method, comprising:
generating, by a processor of an audio system, an audio signal having a volume parameter;
pausing, by the processor, the audio signal generation at a first time;
determining, by the processor, whether the volume parameter is set to a first volume level outside of a subrange of a full scale volume range at the first time; and
setting, by the processor, the volume parameter to a second volume level at a second time, wherein the second volume level is different than the first volume level and is based on one or more acoustic factors existing at the second time in response to the first volume level being outside of the subrange at the first time and in response to the second time being more than a selected interval after the first time.

10. The method of claim 9, further comprising:
receiving, by the processor, a pause command at the first time, wherein the audio signal generation is paused in response to the pause command;
receiving, by the processor, a play command at the second time; and
resuming, by the processor, the audio signal generation at the second time in response to receiving the play command.

11. The method of claim 9, wherein the second volume level is within the subrange regardless of a time difference between the second time and the first time.

12. The method of claim 9, wherein the second volume level is based on a time difference between the second time and the selected interval after the first time.

13. The method of claim 9, wherein the one or more acoustic factors includes one or more of an audio decay time of a surrounding environment, a number of people in the surrounding environment, or a time of day.

14. The method of claim 9, wherein the second volume level is the same as the first volume level in response to the second time being less than the selected interval after the first time regardless of whether the first volume level is outside of the subrange, and wherein the second volume level is different than the first volume level in response to the first volume level being a mute level regardless of whether the second time is more than the selected interval after the first time.

15. A non-transitory machine readable medium storing instructions executable by a processor of an audio system to cause the audio system to perform a method comprising:
generating an audio signal having a volume parameter;
pausing the audio signal generation at a first time;
determining whether the volume parameter is set to a first volume level outside of a subrange of a full scale volume range at the first time; and
setting the volume parameter to a second volume level at a second time, wherein the second volume level is different than the first volume level and is based on one or more acoustic factors existing at the second time in response to the first volume level being outside of the subrange at the first time and in response to the second time being more than a selected interval after the first time.

16. The non-transitory machine readable medium of claim 15, further comprising:
receiving a pause command at the first time, wherein the audio signal generation is paused in response to the pause command;
receiving a play command at the second time; and
resuming the audio signal generation at the second time in response to receiving the play command.

17. The non-transitory machine readable medium of claim 15, wherein the second volume level is within the subrange regardless of a time difference between the second time and the first time.

18. The non-transitory machine readable medium of claim 15, wherein the second volume level is based on a time difference between the second time and the selected interval after the first time.

19. The non-transitory machine readable medium of claim 15, wherein the one or more acoustic factors includes one or more of an audio decay time of a surrounding environment, a number of people in the surrounding environment, or a time of day.

20. The non-transitory machine readable medium of claim 15, wherein the second volume level is the same as the first volume level in response to the second time being less than the selected interval after the first time regardless of whether the first volume level is outside of the subrange, and wherein the second volume level is different than the first volume level in response to the first volume level being a mute level regardless of whether the second time is more than the selected interval after the first time.

21. An audio system, comprising:
a speaker; and
a processor configured to generate an audio signal having a volume parameter, wherein the processor is configured to:
determine whether the volume parameter is set to a first volume level outside of a subrange of a full scale volume range when the audio signal generation is paused at a first time, set the volume parameter to a second volume level inside the subrange in response to the audio signal generation being resumed at a second time that is more than a selected interval after the first time, and
send the audio signal to the speaker for conversion into sound.

\* \* \* \* \*